INPUT CURRENT COMPENSATION WITH TEMPERATURE FOR DIFFERENTIAL TRANSISTOR AMPLIFIER

Filed Feb. 7, 1968 2 Sheets-Sheet 1

INVENTOR.
RICHARD S. BURWEN
BY Alfred W. Barber
ATTORNEY

INVENTOR.
RICHARD S. BURWEN
BY
Alfred W. Barber
ATTORNEY

United States Patent Office 3,467,908

Patented Sept. 16, 1969

3,467,908

INPUT CURRENT COMPENSATION WITH TEMPERATURE FOR DIFFERENTIAL TRANSISTOR AMPLIFIER

Richard S. Burwen, Lexington, Mass., assignor to Analog Devices, Inc., Cambridge, Mass., a corporation of Massachusetts Filed Feb. 7, 1968, Ser. No. 703,627

Int. Cl. H03f *1/32, 3/04*

U.S. Cl. 330—23 7 Claims

ABSTRACT OF THE DISCLOSURE

The input current to a differential transistor amplifier employing by-polar transistors increasing with temperature primarily due to an increase in $h_{FE}$. The increase in input current due to this increase in current gain is of the order of +0.6%/° C. It has been found possible in accordance with the present invention to reduce this change in input current by a factor of two to three times by means of a very simple circuit modification. Basically this improvement is accomplished by providing a voltage drop across two diodes in series which decreases with temperature. This voltage is used to generate a current to the transistor bases which also decreases with temperature largely off-setting the increase in current due to the change in current gain.

BACKGROUND OF THE INVENTION

Field of the invention

The present invention relates to by-polar transistor amplifiers of the differential input type. The invention particularly relates to methods of, and means for, off-setting the input current change due to temperature.

Description of the prior art

A differential transistor amplifier using bi-polar transistors may be stabilized to a large degree by means of a constant current feed to common emitter circuits. This is supplied, in general, by a single transistor connected from the emitters to the return voltage point and this transistor is provided with a bias from a voltage divider connected across the total bias voltage source. Although such an amplifier is quite stable, there still remains a differential input current or drift in input current vs. temperature due to the change $h_{FE}$, that is, the current gain in the transistor, which increases with temperature at approximately 0.6%/° C. for silicon transistors. A simple method has been found, in accordance with the present invention, for providing an off-setting current to the input. This off-setting current varies in a similar manner but in the opposite direction to the input current change due to the change in current gain. This off-setting current is provided by taking the voltage drop across two diodes connected in series and floated across the common emitter circuit of the transistors. Currents are derived from this voltage and applied to the bases of the two input transistors through two current limiting resistors.

Accordingly, one object of the present invention is to provide a method of and means for compensating the input current of a differential input transistor amplifier using by-polar transistors due to temperature changes.

Another object is to provide compensating base current to the input of a differential transistor amplifier which is substantially equal and opposite to the input current change due to temperature induced changes in current gain.

Still another object is to provide an input current compensating circuit particularly adopted to differential transistor amplifiers using constant current emitter biasing.

These and other objects of the present invention will be apparent from the detail description of the invention given in connection with the various figures of the drawing.

Description of the preferred embodiment

Figure 1:
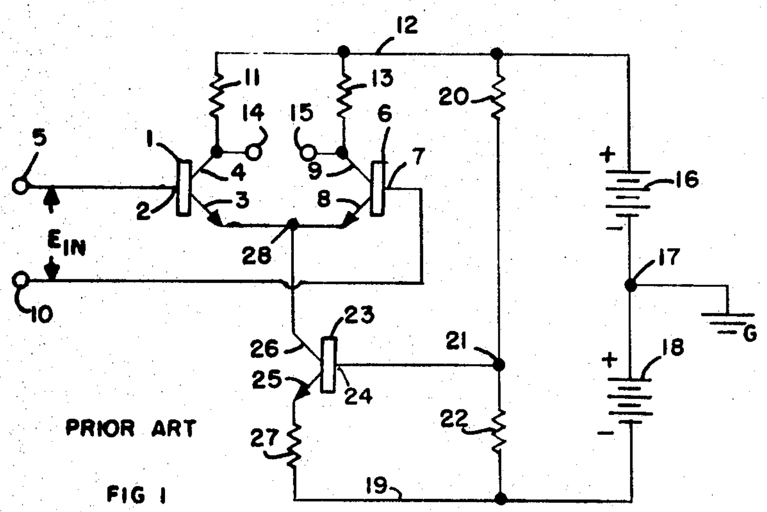
PRIOR ART FIG 1
FIGURE 1 is a schematic circuit diagram of a prior art differential transistor amplifier stage using bi-polar transistors and constant current common emitter feed provided by single transistor connected in constant current mode.

FIGURE 1 is a schematic circuit diagram of a typical prior art amplifier in which bi-polar transistors 1 and 6 are connected as a differential amplifier. Transistor 1 has a base 2, emitter 3, and collector 4; and transistor 6 has a base 7, emitter 8, and collector 9. Base 2 is connected to one input terminal 5 of the amplifier and base 7 is connected to input terminal 10 of the amplifier. Collector 4 is connected through load resistor 11 to positive line 12 and collector 9 is connected through a collector load resistor 13 to the same positive line 12. The output appears at terminals 14 and 15 connected to collectors 4 and 9 respectively. Emitters 3 and 8 are supplied with constant current by transistor 23. Transistor 23 has a base 24, emitter 25, and collector 26. Emitters 3 and 8 are connected to collector 26 at junction point 28, emitter 25 is returned to negative line 19 through emitter resistor 27. Base 24 is connected to the junction 21 between voltage divider resistors 20 and 22 connected from positive line 12 to negative line 19. The amplifier bias is supplied by suitable means such as battery 16 connected between positive line 16 and junction point 17 and battery 18 connected between junction point 17 and negative line 19. Junction point 17 is connected to ground G. This differential amplifier operates in a conventional manner with a high degree of stability due to the constant current supplied to emitters 3 and 8 by transistor 23. Input current flows to the amplifier in response to input voltage connected between terminals 5 and 10, however, it will be subject to variation due to temperature effects. As temperature is increased, the forward current transfer ratio $h_{FE}$ will increase. The rate of increase will be such as to cause the input current to increase at approximately 0.6%/° C. as the temperature increases.

Figure 2:
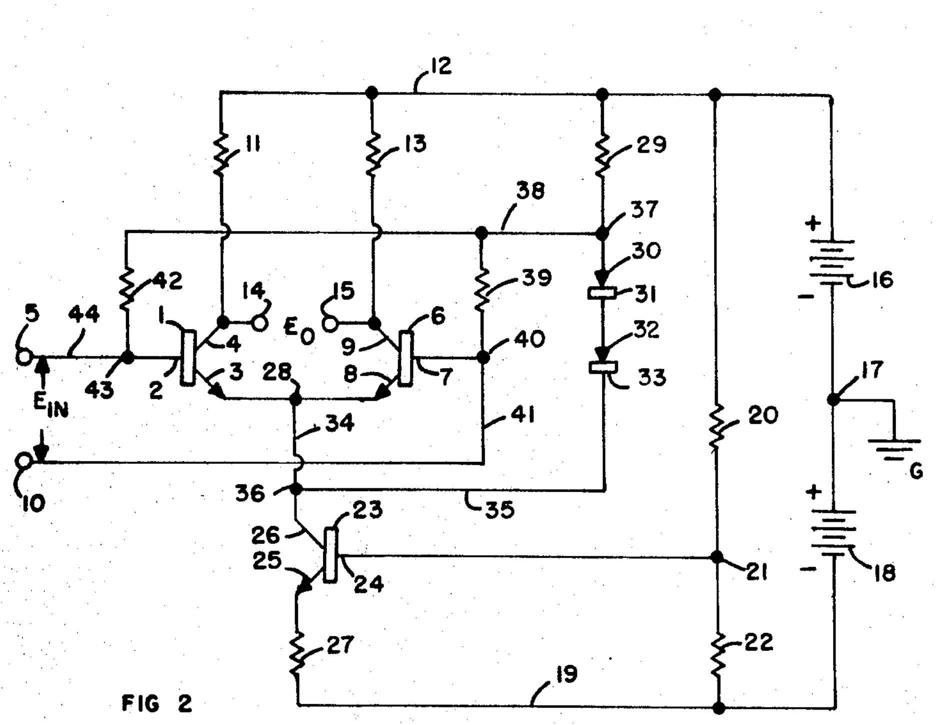
FIGURE 2 is a schematic diagram of a transistor differential amplifier stage showing a preferred form of the present invention connected to a circuit of the prior art as shown in FIGURE 1.

FIGURE 2 is a schematic circuit diagram of the preferred embodiment of the present invention as applied to the differential amplifier shown in FIGURE 1 and described above. Similar numerals are referred to similar parts and these parts function as described above in connection with FIGURE 1. The present invention comprises the addition of a circuit for off-setting the input current change with temperature. This compensating circuit includes two series connected diodes 30–31 and 32–33 which are floated across the constant emitter current supply. Diodes 30–31 and 32–33 are connected in series with a resistor 29 connected to positive line 12 and overlead 35 to junction point 36 which is common to emitters 3 and 8 and collector 26. The voltage drop across these diodes will decrease with temperature at approximately 0.48%/° C. This voltage drop is used to supply compensating current to bases 2 and 7. This compensating current is applied over lead 38 and through resistor 42 to junction point 43 on lead 44 connected to base 2 and through resistor 39 to junction point 40 on lead 41 connecting to base 7. The current thus supplied to bases 2 and 7 will decrease as temperature is increased off-setting the increase in current due to the increase in current transfer ratio or gain as stated above. The net result is a decrease in input current change due to temperature of the order of two to three times.

While the present invention has been shown and described as applying to NPN transistors and, particularly, to bi-polar silicon transistors it will be apparent that the invention can be used to advantage with other transistors. For example, PNP transistors can be substituted for transistors 1, 6 and 23, the diodes 30–31 and 32–33 can be inverted, and the bias batteries 16 and 18 can be reversed to result in a circuit of opposite polarity but utilizing the present invention with the same advantages as those described above in connection with NPN transistors.

Figure 3:
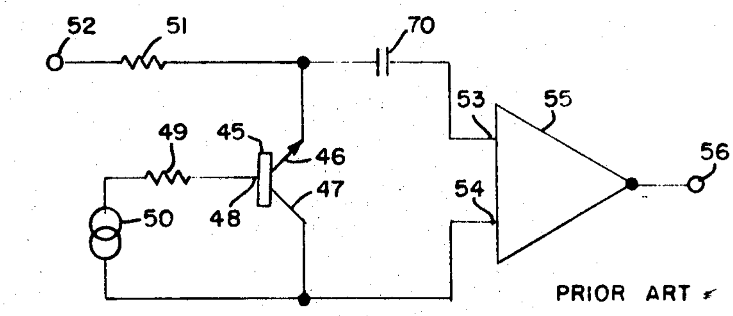
FIGURE 3 is a prior art chopper stabilized amplifier circuit.

FIGURE 3 is a circuit diagram of another prior art device to which the present invention may be applied to advantage. In order to reduce drift to a degree not possible in DC amplifiers so called choppers stabilization is employed. The DC input to be amplified is applied to terminal 52 and through resistor 51. This DC input is chopped by transistor 45 producing AC which is coupled through capacitor 70 and over leads 53 and 54 to AC amplifier 55, which provides in turn an amplified AC output at output terminal 56. Chopper transistor 45 has emitter 46 collector 47 base 48. AC drive to this chopper transistor 45 is provided by a suitable AC source 50 coupled through resistor 49 to base 48. While such a circuit effectively eliminates drift to a first order degree, there is a second order effect due to the change in off-set voltage of transistor 45 with temperature. This off-set voltage is inversely proportional to $h_{FE}$. Since $h_{FE}$ varies with temperature and increases as the temperature increases, the off-set voltage decreases with increasing temperature.

Figure 4:
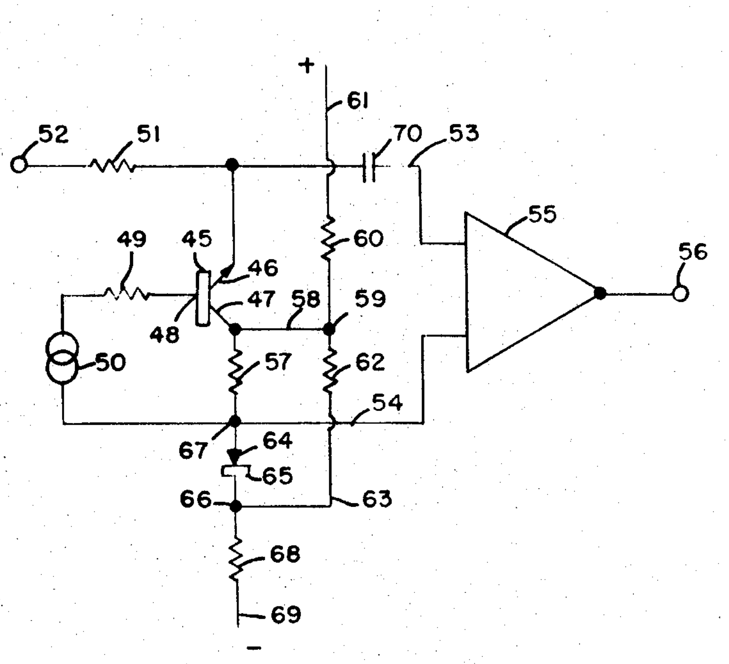
FIGURE 4 illustrates how the current stabilizing circuit of the present invention can be applied to the chopper stabilized amplifier of FIGURE 3.

FIGURE 4 shows how the present invention may be applied to the transistor chopper of FIGURE 3 to provide compensation for the drift due to the change in $h_{FE}$ described above. A voltage drop is provided across diode 64–65 through resistor 68 from a negative source of voltage connected through lead 69 and resistors 57 and 60 to a positive bias source connected over lead 61. Since the forward voltage across diode 64–65 decreases with temperature, an decreasing voltage drop is provided across resistor 57 in series with transistor 45 as temperature increases. The proper choice of resistor 68, 57, 62 and 60 will permit very close compensation of the off-set voltage across transistor 45 with temperature and therefore a substantial cancellation of the drift effect caused by the usual change in off-set voltage.

As stated above in connection with FIGURE 2, transistor 45 may be a PNP transistor provided diode 64–65 and the bias voltages are reversed in polarity.

While only a few forms of the present invention have been shown and described, many variations will be apparent to those skilled in the art and within the spirit and scope of the invention as set forth, in particular in the appended claims.

I claim:

1. In a transistor amplifier, the combination of;
a pair of transistors each including a base, an emitter and a collector;
a source of DC voltage including a first terminal and a second terminal;
constant current means connected between said emitters in common and said first terminal;
separate collector load means connected between said collectors and said second terminal;
a resistor connected to said second terminal;
diode means connected between said resistor and said emitters polled in forward conduction direction;
separate resistors connected between the junction between said resistor and said diode means and said bases.
whereby the bias current supplied to said bases through said separate resistors varies with temperature in the opposite direction to the variation of base current sensitivity of said transistors with temperature.

2. A transistor amplifier as set forth in claim 1; wherein said constant current means comprises a transistor of the same polarity type as said pair of transistors.

3. A transistor amplifier as set forth in claim 1; wherein said diode means comprises two diodes connected in series.

4. A transistor amplifier as set forth in claim 1; wherein said pair of transistors are of the same polarity type and said constant current means comprises a transistor of the same polarity type as said pair of transistors.

5. A transistor amplifier as set forth in claim 1; and including two input signal terminals, one of which is connected to each of said bases.

6. A transistor amplifier as set forth in claim 4; wherein said polarity type is NPN and wherein the anode of said diode means is connected to said resistor.

7. A transistor amplifier as set forth in claim 1; wherein said collector load means are resistors.

References Cited

UNITED STATES PATENTS

| | | | |
|---|---|---|---|
| 3,050,644 | 8/1962 | Ironside | 330—23 X |
| 3,182,269 | 5/1965 | Smith | 330—30 X |
| 3,290,520 | 12/1966 | Wennik | 430—69 X |

ROY LAKE, Primary Examiner

L. J. DAHL, Assistant Examiner

U.S. Cl. X.R.

330—22, 30